(12) United States Patent
Kim et al.

(10) Patent No.: US 10,349,519 B2
(45) Date of Patent: Jul. 9, 2019

(54) PRINTED CIRCUIT BOARD AND METHOD FOR MANUFACTURING THE SAME

(75) Inventors: Ji Su Kim, Seoul (KR); Nam Hee Kim, Seoul (KR); Hye Sun Yoon, Seoul (KR); Il Sang Maeng, Seoul (KR); Sang Seon Ha, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 38 days.

(21) Appl. No.: 14/115,510

(22) PCT Filed: May 2, 2012

(86) PCT No.: PCT/KR2012/003444
§ 371 (c)(1),
(2), (4) Date: Nov. 4, 2013

(87) PCT Pub. No.: WO2012/150817
PCT Pub. Date: Nov. 8, 2012

(65) Prior Publication Data
US 2014/0078703 A1     Mar. 20, 2014

(30) Foreign Application Priority Data

May 3, 2011   (KR) .................. 10-2011-0042156
Jul. 29, 2011  (KR) .................. 10-2011-0076290

(51) Int. Cl.
*H05K 1/18*     (2006.01)
*H05K 1/11*     (2006.01)
(Continued)

(52) U.S. Cl.
CPC .......... *H05K 1/113* (2013.01); *H01L 23/5389* (2013.01); *H01L 24/19* (2013.01);
(Continued)

(58) Field of Classification Search
CPC . H05K 1/11; H05K 1/113; H05K 1/14; H05K 1/18; H05K 3/00; H05K 3/0058; H05K 3/4602
(Continued)

(56) References Cited

U.S. PATENT DOCUMENTS 5,931,371 A *  8/1999  Pao ................... B23K 35/0244
                                                      228/175
6,841,740 B2 *  1/2005  Ogawa ............... H01L 21/4803
                                                      174/255
(Continued)

FOREIGN PATENT DOCUMENTS

CN      101989592 A      3/2011
JP      2001-284780 A    10/2001
(Continued)

OTHER PUBLICATIONS

International Search Report in International Application No. 12779458.4.
(Continued)

*Primary Examiner* — Tuan T Dinh
(74) *Attorney, Agent, or Firm* — Birch, Stewart, Kolasch & Birch, LLP

(57) ABSTRACT

Provided is a method for manufacturing a printed circuit board. The method for manufacturing the printed circuit board includes applying an adhesive on a support board, attaching an electronic device on the adhesive, forming an insulation layer for burying the electronic device, separating the insulation layer from the support board, forming a lower insulation layer under the insulation layer, and forming a via connected to terminals of the electronic device in the insulation layer or the lower insulation layer. Thus, since an adhesion material of an adhesion film does not remain between the internal circuit patterns, and the internal circuit
(Continued)

patterns are not stripped by an adhesion force of the adhesion film, device reliability may be secured.

8 Claims, 5 Drawing Sheets

(51) Int. Cl.
  *H01L 23/538* (2006.01)
  *H05K 3/46* (2006.01)
  *H05K 3/00* (2006.01)
  *H01L 23/00* (2006.01)
(52) U.S. Cl.
  CPC ........... *H05K 1/185* (2013.01); *H05K 3/0058* (2013.01); *H05K 3/4602* (2013.01); *H01L 2224/04105* (2013.01); *H01L 2224/73267* (2013.01); *H01L 2224/8203* (2013.01); *H01L 2924/12042* (2013.01); *H01L 2924/15787* (2013.01); *H05K 3/007* (2013.01); *H05K 3/4652* (2013.01); *H05K 2201/10636* (2013.01); *H05K 2201/10674* (2013.01); *H05K 2203/1469* (2013.01); *Y02P 70/611* (2015.11)
(58) Field of Classification Search
  USPC .......... 361/760–766, 792–795; 174/259–264
  See application file for complete search history.

(56) References Cited

U.S. PATENT DOCUMENTS

| | | | | |
|---|---|---|---|---|
| 7,186,919 | B2 * | 3/2007 | Kim | H05K 1/162 174/250 |
| 7,842,887 | B2 * | 11/2010 | Sakamoto | H01L 21/4846 174/260 |
| 8,024,858 | B2 * | 9/2011 | Tanaka | H01L 24/82 29/832 |
| 8,198,541 | B2 * | 6/2012 | Sasaoka | H05K 1/0206 174/252 |
| 8,284,562 | B2 * | 10/2012 | Lee | H05K 1/185 174/262 |
| 8,432,022 | B1 * | 4/2013 | Huemoeller | H01L 23/552 257/508 |
| 2004/0150966 | A1 * | 8/2004 | Hu | H01L 23/5389 361/763 |
| 2006/0118931 | A1 * | 6/2006 | Ho | H01L 23/49822 257/678 |
| 2006/0128069 | A1 * | 6/2006 | Hsu | H01L 23/5389 438/124 |
| 2006/0145328 | A1 | 7/2006 | Hsu | |
| 2006/0191711 | A1 * | 8/2006 | Cho | H01L 23/5389 174/260 |
| 2008/0318055 | A1 | 12/2008 | Fillion et al. | |
| 2009/0073667 | A1 * | 3/2009 | Chung | H01L 23/3114 361/763 |
| 2010/0097770 | A1 | 4/2010 | Park et al. | |
| 2010/0155116 | A1 | 6/2010 | Kawai et al. | |
| 2010/0163290 | A1 | 7/2010 | Nagata | |
| 2010/0163293 | A1 | 7/2010 | Kawai et al. | |
| 2011/0018123 | A1 | 1/2011 | An et al. | |
| 2011/0048780 | A1 | 3/2011 | Jeong et al. | |
| 2011/0069448 | A1 | 3/2011 | Weichslberger et al. | |
| 2011/0127080 | A1 | 6/2011 | Fjelstad | |
| 2011/0203107 | A1 | 8/2011 | Schrittwieser et al. | |

FOREIGN PATENT DOCUMENTS

| | | |
|---|---|---|
| JP | 2004-127970 A | 4/2004 |
| JP | 2008-131039 A | 6/2008 |
| JP | 2008-177554 A | 7/2008 |
| JP | 2010-157709 A | 7/2010 |
| JP | 2010153863 A | 7/2010 |
| JP | 2010157718 A | 7/2010 |
| JP | 2011-029585 A | 2/2011 |
| KR | 10-0645643 B1 | 11/2006 |
| KR | 10-0661296 B1 | 12/2006 |
| KR | 10-0733251 B1 | 6/2007 |
| KR | 10-0758229 B | 9/2007 |
| KR | 10-2007-0101408 A | 10/2007 |
| KR | 10-0821154 B1 | 4/2008 |
| TW | 2006-21115 A | 6/2006 |
| TW | 2009-42105 A | 10/2009 |
| WO | WO-2008-150898 A2 | 12/2008 |
| WO | WO-2010-048653 A2 | 5/2010 |

OTHER PUBLICATIONS

Office Action dated Dec. 6, 2013 in Taiwanese Application No. 101115706.
International Search Report in International Application No. PCT/KR2012/003444, filed May 2, 2012.
Notice of Allowance dated Apr. 29, 2013 in Korean Application No. 10-2011-0076290.
Office Action dated Sep. 18, 2012, in Korean Application No. 10-2011-0076290.
Office Action dated May 26, 2015 in Japanese Application No. 2014-509243.
Office Action dated Oct. 21, 2014 in Japanese Application No. 2014-509243.
Office Action dated Mar. 3, 2016 in Chinese Application No. 201280032592.4.
Office Action dated Oct. 25, 2016 in Chinese Application No. 201280032592.4.

* cited by examiner

PRINTED CIRCUIT BOARD AND METHOD FOR MANUFACTURING THE SAME

CROSS-REFERENCE TO RELATED APPLICATIONS

This application is the U.S. national stage application of International Patent Application No. PCT/KR2012/003444, filed May 2, 2012, which claims priority to Korean Application No. 10-2011-0042156, filed May 3, 2011, and Application No. 10-2011-0076290, filed Jul. 29, 2011, the disclosures of each of which are incorporated herein by reference in their entirety.

TECHNICAL

The present disclosure relates to a printed circuit board and a method for manufacturing the same.

BACKGROUND ART

Printed circuit boards (PCBs) denote boards just before electric components are mounted. In such a PCB, a circuit line pattern is printed on an electrical insulation board using a conductive material such as copper. That is, PCBs denote circuit boards in which an installation position of each of the components is decided and a circuit pattern connecting the components to each other is printed and fixed on a surface of a flat panel to densely mount various electric devices on the flat panel.

An embedded PCB in which each component is buried in the PCB is being provided.

FIG. 1 is a view of a general embedded PCB.

Referring to FIG. 1, the general embedded PCB 10 includes an electronic device 5 buried between a plurality of insulation layers 1, a conductive buried circuit pattern 2 disposed between the plurality of insulation layers 1, and a via hole connecting circuits disposed in layers different from each other to each other.

A solder or buffer 6 is disposed under the buried electronic device 5, and a pad 7 connected to an external circuit pattern 9 is disposed under the solder or buffer 6. Also, a via 8 connecting the pad 7 to the external circuit pattern 9 is disposed under the buried electronic device 5.

As described above, in a case where the electronic device 5 is mounted within the PCB, a bonding sheet and insulation layer 1 for mounting the electronic device 5 are attached to mount the electronic device 5, and then the bonding sheet is removed.

Here, since an adhesive component of the bonding sheet remains on one surface of the electronic device 5, the adhesive component may affect device characteristics. Thus, a phenomenon in which the circuit pattern 9 is separated together with the bonding sheet may occur to reduce reliability.

DISCLOSURE OF INVENTION

Technical Problem

Embodiments provide a method for manufacturing an embedded printed circuit board on which an electronic device can be reliably mounted.

Solution to Problem

In one embodiment, a method for manufacturing a printed circuit board includes: applying an adhesive on a support board; attaching an electronic device on the adhesive; forming an insulation layer for burying the electronic device; separating the insulation layer from the support board; forming a lower insulation layer under the insulation layer; and forming a via connected to terminals of the electronic device in the insulation layer or the lower insulation layer.

Advantageous Effects of Invention

According to the embodiments, in the embedded PCB in which the electronic device is buried, when the electronic device is mounted, the adhesion paste may be applied on the release film supporting the electronic device to fix the electronic device and remove the release film. Thus, unlike the related art, since the adhesion material of the adhesion film does not remain between the internal circuit patterns, and also the internal circuit patterns are not stripped by the adhesion force of the adhesion film, the device reliability may be secured.

MODE FOR THE INVENTION

Figure 1:
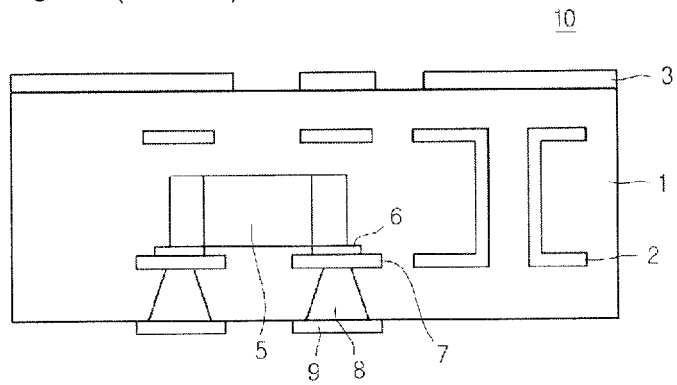
FIG. 1 is a sectional view of a printed circuit board according to a related art.

Hereinafter, preferred embodiments of the present invention will be described in detail with reference to the accompanying drawings in such a manner that the technical idea of the present invention may easily be carried out by a person with ordinary skill in the art to which the invention pertains. The present disclosure may, however, be embodied in different forms and should not be construed as limited to the embodiments set forth herein.

In the specification, when it is described that one comprises (or includes or has) some elements, it should be understood that it may comprise (or include or has) only those elements, or it may comprise (or include or have) other elements as well as those elements if there is no specific limitation.

In the drawings, anything unnecessary for describing the present disclosure will be omitted for clarity, and thicknesses are enlarged for the purpose of clearly illustrating layers and areas. Like reference numerals in the drawings denote like elements, and thus their descriptions will be omitted.

it will be understood that when a layer, a film, a region, or a plate is referred to as being 'on' another layer, film, region, or plate, it can be directly on the other layer, region, or plate, or intervening layers, films, regions, or plates may also be present. On the other hand, it will also be understood that when a layer, a film, an area or a plate is referred to as being "directly on" another one, intervening layers, films, areas, and plates may not be present.

The present disclosure provides an embedded printed circuit board (PCB) in which an electronic device 200 is buried and mounted. According to the embedded PCB, when a board for mounting and support the electronic device 200 is applied and then removed, reliability may be secured.

Hereinafter, a PCB according to an embodiment will be described with reference to FIGS. 2 to 17.

Figure 2:
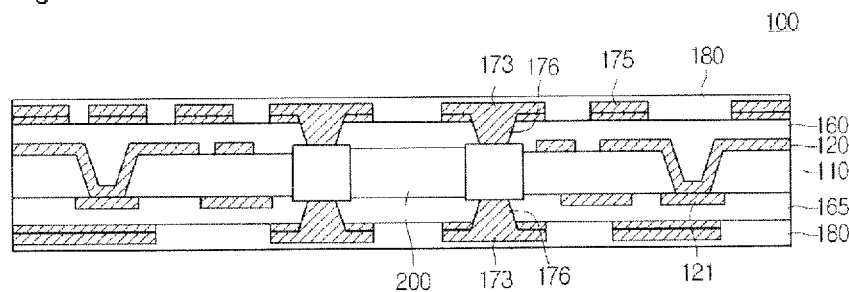
FIG. 2 is a sectional view of a printed circuit board according to an embodiment.
Figure 3:
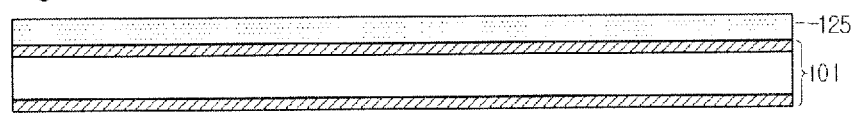
FIGS. 3 to 17 are sectional views illustrating a process for manufacturing the printed circuit board of FIG. 2.

FIG. 2 is a sectional view of a printed circuit board according to an embodiment.

Referring to FIG. 2, a printed circuit board (PCB) 100 according to an embodiment includes a first insulation layer 110, internal circuit patterns 121 disposed above/under the first insulation layer 110, second and third insulation layers 160 and 165 disposed above/under the first insulation layer 110, an external circuit pattern 175 disposed above the second and third insulation layers 160 and 165, and a coverlay 180. Also, the PCB 100 further includes a plurality of electronic devices 200 buried therein.

The first to third insulation layers 110, 160, and 165 constitute an insulation plate. Also, the insulation plate may be a thermosetting or thermoplastic polymer board, a ceramic board, an organic/inorganic complex board, or a glass fiber impregnated board. When the insulation plate contains a polymer resin, the polymer resin may include an epoxy-based insulation resin. Alternatively, the polymer resin may include a polyimide-based resin.

The first to third insulation layers 110, 160, and 165 may be formed of materials different from each other. For example, the first insulation layer 110 may be an impregnated board containing a glass fiber, and the second and third insulation layers 160 and 165 may be insulation sheets formed of only a resin.

The first insulation layer 110 serves as a central insulation layer. The first insulation layer 110 may have a thickness greater than that of each of the second and third insulation layers 160 and 165. Also, the first insulation layer 110 may have a thickness greater than that of each of electronic devices 200.

The first insulation layer 110 has an opening configured to mount the electronic devices 200. The internal circuit patterns 121 may be disposed above/under the first insulation layer 110, and a conductive via connecting the upper and lower internal circuit patterns 121 to each other may be disposed in the first insulation layer 110.

The external circuit pattern 175 may be disposed above the second and third insulation layers 160 and 165 which are respectively disposed above/under the first insulation layer 110. A portion of the external circuit pattern 175 may be a pad 173 connected to a terminal of the electronic device 175.

A via 176 passing through the second and third insulation layers 160 and 165 is defined between the pad 173 and the electronic device 200.

The via 176 may be defined on only one surface of the electronic device 200. Alternatively, the via 176 may be defined on top and bottom surfaces of the electronic device 200.

The electronic device 200 buried by the first to third insulation layers 110, 160, and 165 may be a passive device. For example, the electronic device 200 may include a resistor, an inductor, or a capacitor. Terminals for receiving a current or voltage from the outside are disposed on both ends of the electronic device 200.

The pad 173 connected to the conductive via 176 may extend to top surfaces of the second and third insulation layers 160 and 165.

Each of the internal circuit patterns 121 and the external circuit pattern 175 may be formed of an alloy containing copper. The external circuit pattern 175 may include at least two layers.

The external circuit pattern 175 is protected by the coverlay 180 from the outside.

The coverlay 180 may be formed of a dry film or a general solder resist.

Although the two circuit patterns 121 and 175 are provided in this embodiment, the present disclosure is not limited thereto. For example, the circuit patterns 121 and 175 may be provided in plurality.

Hereinafter, a process of manufacturing the PCB FIG. 2 will be described with reference to FIGS. 3 to 15.

FIGS. 3 to 17 are sectional views illustrating a process for manufacturing a PCB according to an embodiment.

A release film 125 is formed on a carrier board 101.

The release film 125 denotes a film having a peal stress approaching about zero after being cured.

The carrier board 101 may be a general support board. For example, a copper cladded laminate (CCL) may be used as the carrier board 101.

Figure 4:
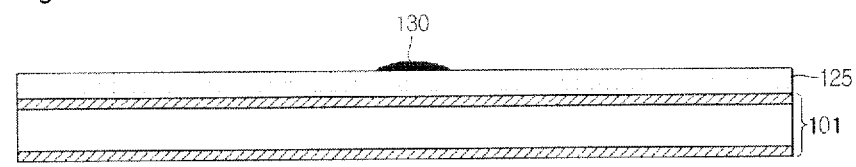

Referring to FIG. 4, an adhesion paste 130 is applied to an area of the release film 125 on which electronic devices 200 are mounted.

Figure 5:
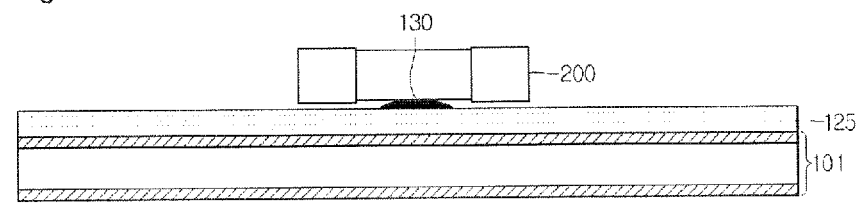

The adhesion paste 130 is applied to a central area between both terminals on the area on which each of the electronic devices 200 is mounted. The electronic device 200 of FIG. 5 is mounted on the adhesion paste 130. The electronic device 200 may be a passive device. For example, the electronic device 200 may be a resistor, an inductor, or a capacitor.

Figure 6:
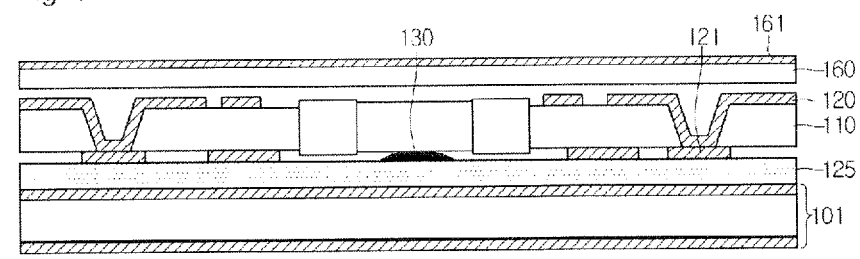

Referring to FIG. 6, a first insulation layer 110 having an opening through which the electronic device 200 is inserted is formed.

A via is formed within the first insulation layer 110 so that the via is not aligned with the electronic device 200. Also, internal circuit patterns 121 connected to the via and disposed above/under the first insulation layer 110 may be formed.

Both surfaces of a CCL may be patterned to form the internal circuit pattern 121 and the first insulation layer 110.

Here, an opening of the first insulation layer 110 may have the same width as that of the electronic device 200. However, considering an alignment error, the opening of the first insulation layer 110 may have a width greater than that of the electronic device 200.

The first insulation layer 110 may be a thermosetting or thermoplastic polymer board, a ceramic board, an organic/inorganic complex board, or a glass fiber impregnated board. When the first insulation layer 110 contains a polymer resin, the first insulation layer 110 may be formed of an epoxy-based insulation resin. Alternatively, the first insulation layer 110 may be formed of a polyimide-based resin.

Figure 7:
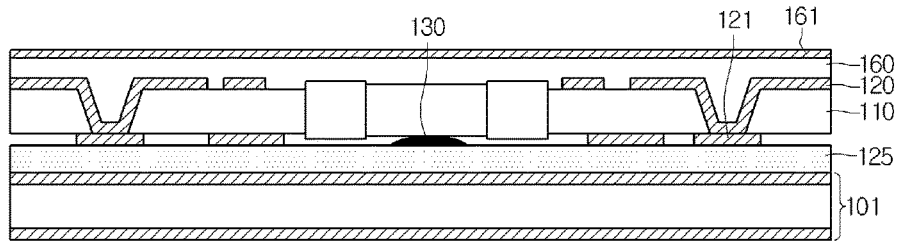

Here, a stacked structure of the second insulation layer 160 and a first metal layer 161 is stacked on the first insulation layer 110, and then heat and pressure are applied to the resultant structure as shown in FIG. 7.

Figure 8:
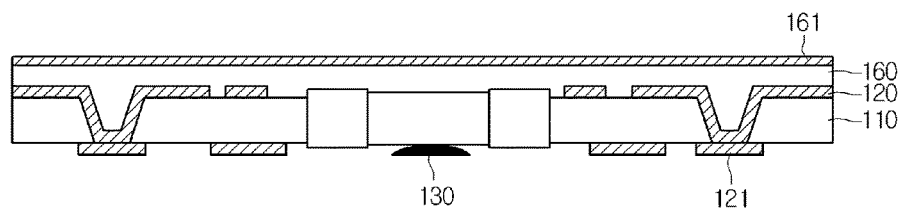

Next, as shown in FIG. 8, the release film 125 is removed to remove the carrier board 101 attached to the release film 125.

Here, since an adhesion force between the adhesion paste 130 and the release film 125 is greater than that between the adhesion paste 130 and the electronic device 200, the adhesion paste 130 may remain on a bottom surface of the electronic device 200. However, since a peal stress has a value approaching about zero after the release film 125 is cured, the internal circuit pattern 121 is not stripped even though the release film 125 is removed.

Figure 9:
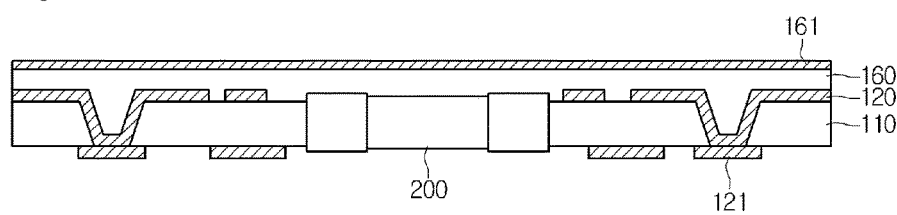

Next, as shown in FIG. 9, the adhesion paste 130 is removed.

Since the adhesion paste 130 contains a non-conductive polymer, the adhesion paste 130 may be removed through chemical processing.

Figure 10:
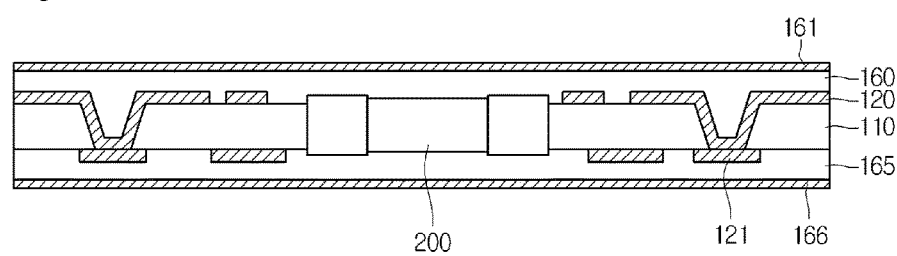

Next, a stacked structure of a third insulation layer 165 and a second metal layer 166 is stacked on a lower portion of the first insulation layer 110, and then, heat and pressure are applied to resultant structure as shown in FIG. 10 to cure the first to third insulation layers 110, 160, and 165, thereby forming one insulation plate. Here, the insulation plate is maintained in a state where the electronic device 200 is buried therein.

Figure 11:
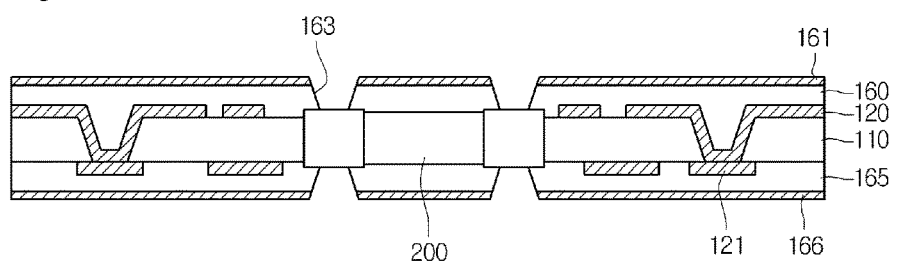

Next, as shown in FIG. 11, a via hole 163 is formed in the first and second metal layers 161 and 166 and the second and third insulation layers 160 and 165.

A physical drilling process may be performed to form the via hole 163. Alternatively, the via hole 163 may be formed using a laser. When the via hole 163 is formed using the laser, each of the first and second metal layers 161 and 166 and the second and third insulation layers 110, 160, and 165 may be opened using a YAG laser or a $CO_2$ laser.

Here, the formed via hole 163 may include a via hole 163 opening upper and lower portions of a terminal of the electronic device 200. Although not shown, a via hole for electrically connecting the external and internal circuit patterns 121 and 175 to each other may be formed together.

Figure 12:
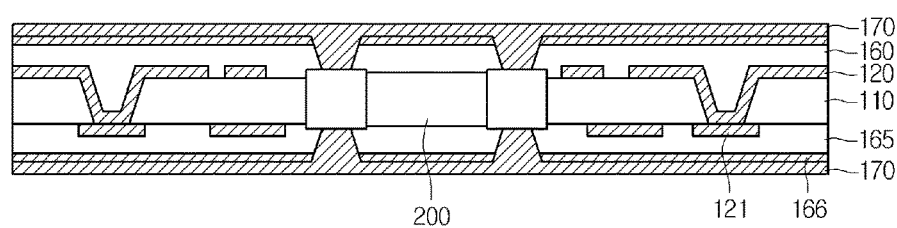
Figure 13:
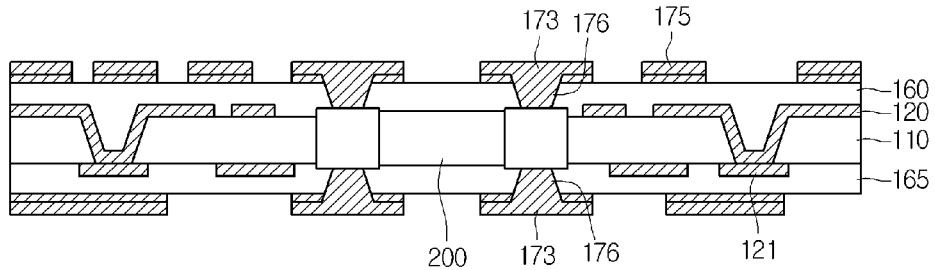
Figure 14:
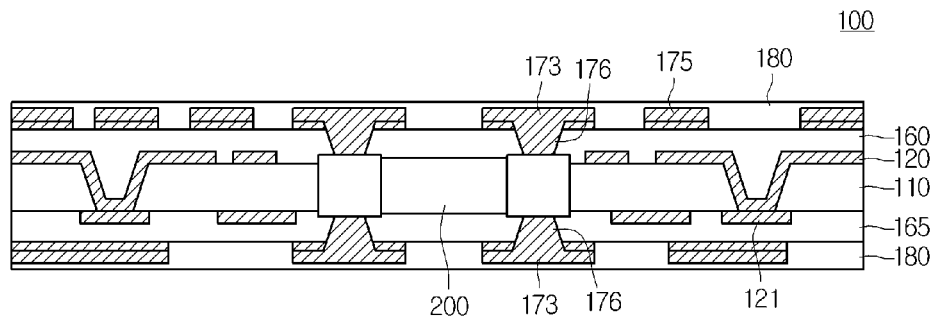

Next, a plating process is performed as shown in FIG. 12 to form a via 176 for burying the via hole 163. Then, a plating layer 170 covering upper portions of the second and third insulation layers 160 and 165 is formed.

An electroless plating process may be performed on the second and third insulation layers 160 and 165, and then an electroplating process may be performed using the electroless plating layer as a seed to form the plating layer 170.

A desmear process for removing smears of the second and third insulation layers 160 and 165 may be performed before the plating process is performed to smoothly perform the electroless plating process.

Next, the plating layer 170 is etched to form the external circuit pattern 175 above the second and third insulation layers 160 and 165.

Here, the external circuit pattern 175 includes a pad 173 formed on a top surface of the via 176 in which the via hole 163 is buried. The pad 173 may include an areas expanded on each of the second and third insulation layers 160 and 165.

Figure 15:
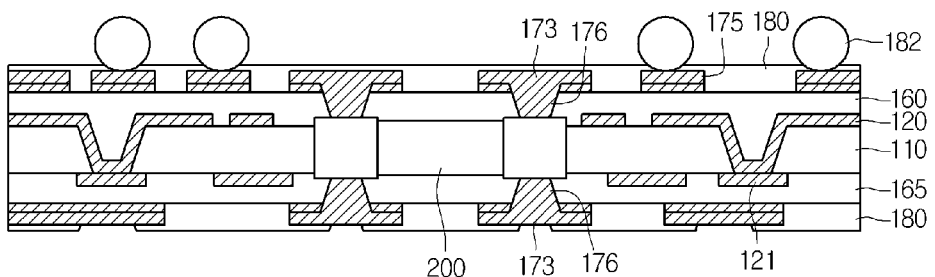

Thereafter, a coverlay 180 for burying the circuit pattern 175 is attached, and then a portion of the coverlay 180 is etched to expose the pad 173 as shown in FIG. 15. Then, a solder ball 182 is formed on the exposed pad 173 to form a PCB 100.

Figure 16:
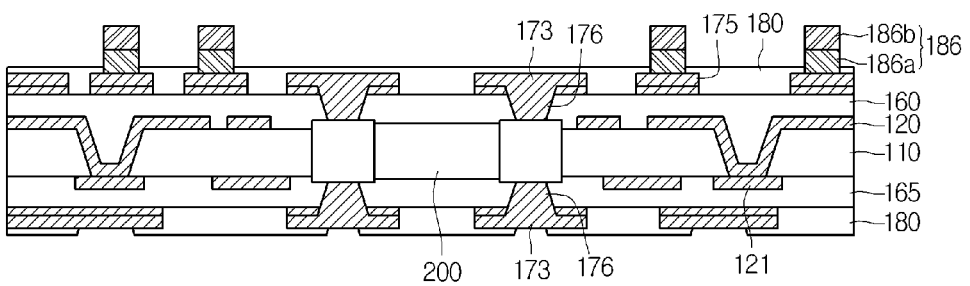

According to another embodiment, as shown in FIG. 16, a coverlay 180 for burying the circuit pattern 175 may be attached, and then a portion of the coverlay 180 may be etched to expose the pad 173. Then, a copper bump 184 may be formed on the exposed pad 173 to form an embedded PCB 100.

Figure 17:
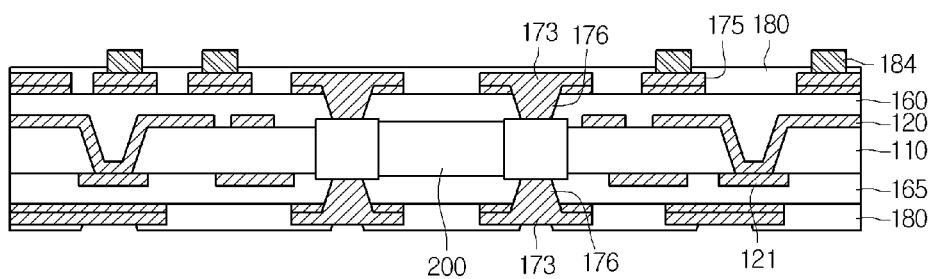

According to further another embodiment, as shown in FIG. 17, a coverlay 180 for burying the circuit pattern 175 may be attached, and then a portion of the coverlay 180 may be etched to expose the pad 173. Then, a bump 186 including a copper bump 186a and a solder 186b may be formed on the exposed pad 173 to form an embedded PCB 100.

That is, the solder ball 182 may be formed on the pad 173. Alternatively, the copper bump 184 may be formed of the pad 173. Also, the solder may be additionally formed on the copper bump 184.

As described above, in the embedded PCB 100 in which the electronic device 200 is buried, when the electronic device 200 is mounted, the adhesion paste 130 is applied on the release film 125 supporting the electronic device 200 to fix the electronic device 200. Then, the release film 125 is removed. Thus, since an adhesion material of a conventional adhesion film does not remain between the internal circuit patterns 121, and also the internal circuit patterns 121 are not stripped by an adhesion force of the adhesion film, the device reliability may be secured.

Hereinafter, an another embodiment will be described with reference to FIGS. 18 to 29.

Figure 18:
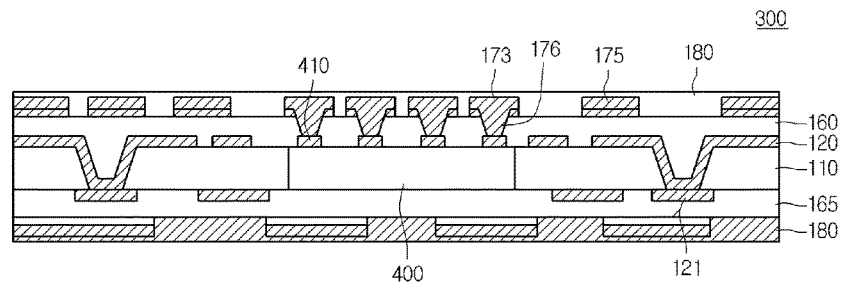
FIG. 18 is a sectional view of a printed circuit board according to another embodiment.

FIG. 18 is a sectional view of a PCB according to another embodiment.

Referring to FIG. 18, a PCB 300 according to another embodiment includes a first insulation layer 110, internal circuit patterns 121 disposed above/under the first insulation layer 110, second and third insulation layers 160 and 165 disposed above/under the first insulation layer 110, an external circuit pattern 175 disposed above the second and third insulation layers 160 and 165, and a coverlay 180. Also, the PCB 300 further includes a plurality of electronic devices 400 buried therein.

The first to third insulation layers 110, 160, and 165 constitute an insulation plate. Also, the insulation plate may be a thermosetting or thermoplastic polymer board, a ceramic board, an organic/inorganic complex board, or a glass fiber impregnated board. When the insulation plate contains a polymer resin, the polymer resin may include an epoxy-based insulation resin. Alternatively, the polymer resin may include a polyimide-based resin.

The first to third insulation layers 110, 160, and 165 may be formed of materials different from each other. For example, the first insulation layer 110 may be an impregnated board containing a glass fiber, and the second and third insulation layers 160 and 165 may be insulation sheets formed of only a resin.

The first insulation layer 110 serves as a central insulation layer. The first insulation layer 110 may have a thickness greater than that of each of the second and third insulation layers 160 and 165. Also, the first insulation layer 110 may have a thickness greater than that of each of electronic devices 400.

The first insulation layer 110 has an opening configured to mount the electronic devices 400. The internal circuit patterns 121 may be disposed above/under the first insulation layer 110, and a conductive via connecting the upper and lower internal circuit patterns 121 to each other may be disposed in the first insulation layer 110.

The external circuit pattern 175 may be disposed above the second and third insulation layers 160 and 165 which are respectively disposed above/under the first insulation layer 110. A portion of the external circuit pattern 175 may be a pad 173 connected to a terminal of the electronic device 200.

A via 176 passing through the second and third insulation layers 160 and 165 is defined between the pad 173 and the electronic device 400.

The via 176 may be defined on only one surface of the electronic device 400. Alternatively, the via 176 may be defined on top and bottom surfaces of the electronic device 200.

The electronic device 400 buried by the first to third insulation layers 110, 160, and 165 may be an active device. For example, the electronic device 400 may include a transistor, an amplifier, a diode, or a semiconductor chip.

A device pad 410 is exposed on a top surface of the electronic device 400. The device pad 410 is connected to the conductive via 176.

The number of device pads 410 is decided according to a kind of the active device.

The pad connected to the conductive via 176 may extend to top surfaces of the second and third insulation layers 160 and 165.

Each of the internal circuit patterns 121 and the external circuit pattern 175 may be formed of an alloy containing copper. The external circuit pattern 175 may include at least two layers.

The external circuit pattern 175 is protected by the coverlay 180 from the outside.

The coverlay 180 may be formed of a dry film or a general solder resist.

Although the two circuit patterns 150 and 175 are provided in this embodiment, the present disclosure is not limited thereto. For example, the circuit patterns 121 and 175 may be provided in plurality.

Hereinafter, a method of manufacturing the PCB 300 FIG. 18 will be described with reference to FIGS. 19 to 29.

Figure 19:
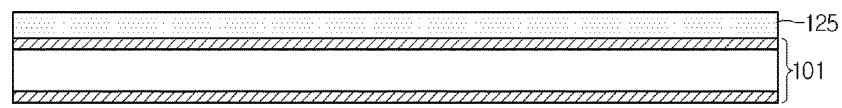
FIGS. 19 to 29 are sectional views illustrating a process for manufacturing the printed circuit board of FIG. 18.

Referring to FIG. 19, a release film 125 is formed on a carrier board 101.

The release film 125 denotes a film having a peal stress approaching about zero after being cured.

The carrier board 101 may be a general support board. For example, a copper claded laminate (CCL) may be used as the carrier board 101.

Figure 20:
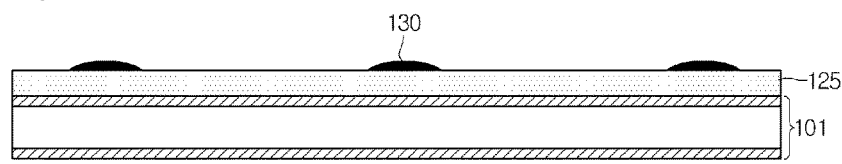

Referring to FIG. 20, an adhesion paste 130 is applied to an area on which an electronic device 400 of the release film 125 is mounted.

The adhesion paste 130 is applied to the area on which the electronic device 400 is mounted. In addition, the adhesion paste 130 may be formed on a predetermined area to prevent the PCB 300 from being shaken.

Figure 21:
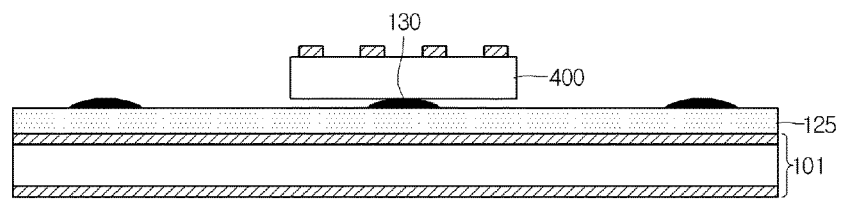

The electronic device 400 of FIG. 21 is mounted on the adhesion paste 130. The electronic device 400 may be an active device. For example, the electronic device 400 may be a transistor, an amplifier, a diode, or a semiconductor chip.

Figure 22:
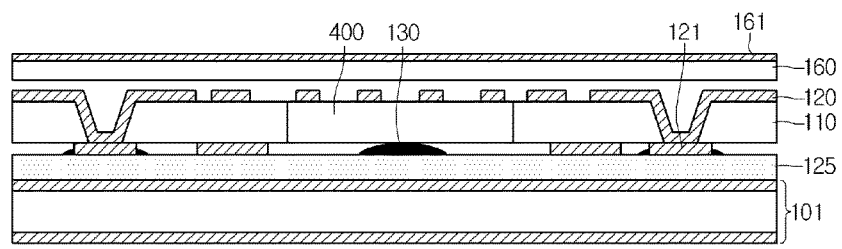

Referring to FIG. 22, a first insulation layer 110 having an opening through which the electronic device 400 is inserted is formed.

A via is formed within the first insulation layer 110 so that the via is not aligned with the electronic devices. Also, internal circuit patterns 121 connected to the via and disposed above/under the first insulation layer 110 may be formed.

Both surfaces of the CCL may be patterned to form the internal circuit pattern 121 and the first insulation layer 110.

Here, the opening of the first insulation layer 110 may have the same width as that of the electronic device 400. However, considering an alignment error, the opening of the first insulation layer 110 may have a width greater than that of the electronic device 400.

The first insulation layer 110 may be a thermosetting or thermoplastic polymer board, a ceramic board, an organic/inorganic complex board, or a glass fiber impregnated board. When the first insulation layer 110 contains a polymer resin, the first insulation layer 110 may be formed of an epoxy-based insulation resin. Alternatively, the first insulation layer 110 may be formed of a polyimide-based resin.

Figure 23:
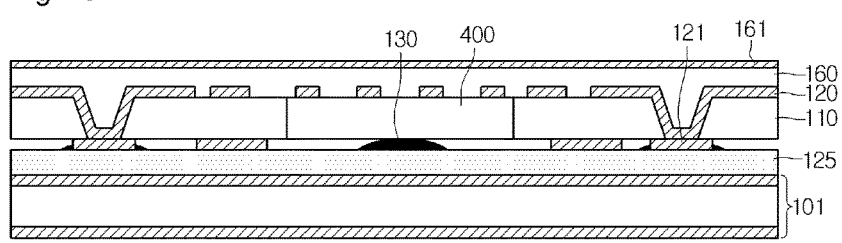

Here, a stacked structure of the second insulation layer 160 and the first metal layer 161 is stacked on the first insulation layer 110, and then heat and pressure may be applied to the resultant structure as shown in FIG. 23.

Figure 24:
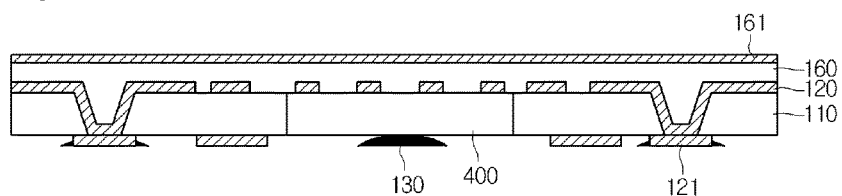

Next, as shown in FIG. 24, the release film 125 is removed to remove the carrier board 101 attached to the release film 125.

Here, since an adhesion force between the adhesion paste 130 and the release film 125 is greater than that between the adhesion paste 130 and the electronic device 400, the adhesion paste 130 may remain on a bottom surface of the electronic device 400. However, since a peal stress has a value approaching about zero after the release film 125 is cured, the internal circuit pattern 121 is not stripped even though the release film 125 is removed.

Figure 25:
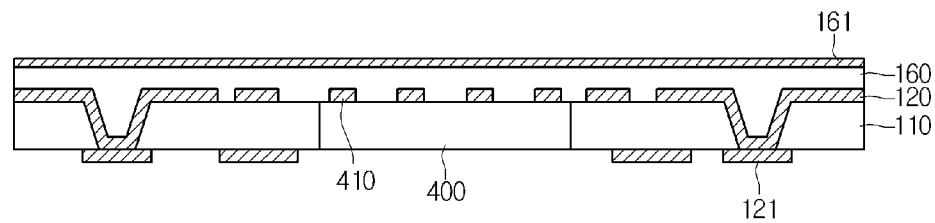

Next, as shown in FIG. 25, the adhesion paste 130 is removed.

Since the adhesion paste 130 contains a non-conductive polymer, the adhesion paste 130 may be removed through chemical processing.

Figure 26:
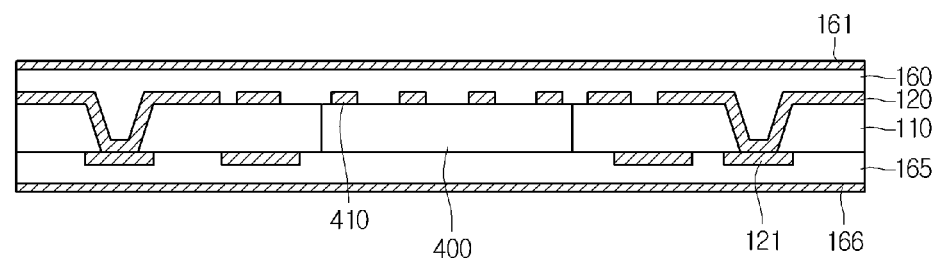

Next, a stacked structure of a third insulation layer 165 and a second metal layer 166 is stacked on a lower portion of the first insulation layer 110, and then, heat and pressure are applied to resultant structure as shown in FIG. 26 to cure the first to third insulation layers 110, 160, and 165, thereby forming one insulation plate. Here, the insulation plate is maintained in a state where the electronic device 400 is buried therein.

Figure 27:
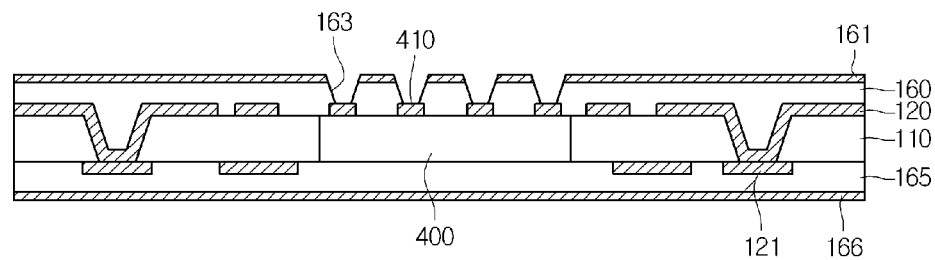

Next, as shown in FIG. 27, a via hole 163 is formed in the first and second metal layers 161 and 166 and the second and third insulation layers 160 and 165.

A physical drilling process may be performed to form the via hole 163. Alternatively, the via hole 163 may be formed using a laser. When the via hole 163 is formed using the laser, each of the first and second metal layers 161 and 166 and the second and third insulation layers 110, 160, and 165 may be opened using a YAG laser or a $CO_2$ laser.

Here, the formed via hole 163 may include a via hole 163 opening a device pad 410 of the electronic device 400. Although not shown, a via hole for electrically connecting the external and internal circuit patterns 121 and 175 to each other may be formed together.

Figure 28:
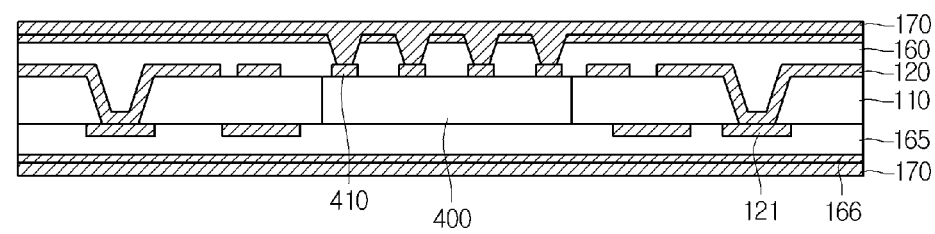

Next, a plating process is performed as shown in FIG. 28 to form a via 176 for burying the via hole 163. Then, a plating layer 170 covering upper portions of the second and third insulation layers 160 and 165 is formed.

An electroless plating process may be performed on the second and third insulation layers 160 and 165, and then an electroplating process may be performed using the electroless plating layer as a seed layer to form the plating layer 170.

A desmear process for removing smears of the second and third insulation layers 160 and 165 may be performed before the plating process is performed to smoothly perform the electroless plating process.

Figure 29:
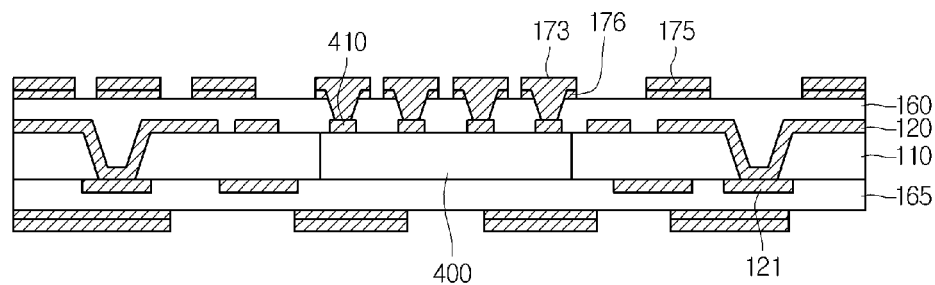

Next, the plating layer 170 is etched to form the external circuit pattern 175 of FIG. 29 above the second and third insulation layers 160 and 165.

Here, the external circuit pattern 175 includes a pad 173 formed on a top surface of the via 176 in which the via hole 163 is buried. The pad 173 may include an areas expanded on each of the second and third insulation layers 160 and 165.

Thereafter, a coverlay 180 for burying the circuit pattern 175 is attached, and then a portion of the coverlay 180 is etched to expose the pad 173. Then, a solder ball is formed on the exposed pad 173 to form an embedded PCB 300.

As described above, in the embedded PCB 300 in which the electronic device 400 is buried, when the electronic device 400 is mounted, the adhesion paste 130 is applied on the release film 125 supporting the electronic device 400 to fix the electronic device 200. Then, the release film 125 is removed. Thus, unlike a related art, since the adhesion material of the adhesion film does not remain between the internal circuit patterns 121, and also the internal circuit patterns 121 are not stripped by an adhesion force of the adhesion film, the device reliability may be secured.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A method for manufacturing a printed circuit board, the method comprising:
   applying an adhesive on an area of a support board for mounting an electronic device, wherein the adhesive is only applied on a central area between both terminals of the electronic device on the area on which the electronic device is mounted;
   attaching the electronic device on the adhesive;
   forming a central insulation layer to bury the electronic device;
   forming an upper insulation layer on the central insulation layer;
   stripping a release film to remove the support board;
   removing the adhesive remaining on a bottom surface of the electronic device;
   forming a lower insulation layer under the central insulation layer;
   forming a via connected to terminals of the electronic device in the upper insulation layer or the lower insulation layer;
   forming an external circuit pattern on the upper insulation layer or the lower insulation layer after the via is formed;
   forming a coverlay protecting the external pattern after the external circuit pattern is formed, wherein the coverlay has an opening section for exposing a surface of the external circuit pattern;
   forming a first bump on the external circuit pattern exposed by the opening section of the coverlay, wherein the first bump protrudes from a surface of the coverlay; and
   forming a second bump on the first bump;
   wherein the adhesive is not applied on an edge area corresponding to the both terminals of the electronic device on the area on which the electronic device is mounted;
   wherein the first bump is a copper bump; and
   wherein the second bump is a solder bump.

2. The method according to claim 1, wherein the applying of the adhesive further comprises:
   forming the release film on the support board, and
   wherein the adhesive is applied on the release film.

3. The method according to claim 1, wherein a lower surface of the electronic device includes a first region corresponding to the both terminals and a second region corresponding to the central area between the both terminals, and
   wherein attaching of the electronic device comprises:
   floating the first region of the electronic device on the support board; and
   contacting the second region of the electronic device with the adhesive applied on the support board.

4. The method according to claim 1, wherein the forming of the external circuit pattern comprises:
   forming a first metal layer on the upper insulation layer;
   performing an excessive plating process while forming the via to form a plating layer on the first metal layer; and
   etching the first metal layer and the plating layer formed on the first metal layer at the same time to form the external circuit pattern.

5. The method according to claim 1, wherein the central insulation layer further comprises an internal circuit pattern.

6. The method according to claim 4, wherein the external circuit pattern further comprises a pad connected to the via.

7. A printed circuit board comprising:
   a central insulation layer in which an electronic device is buried;
   a first external insulation layer disposed above the central insulation layer, the first external insulation layer having a first opening for exposing a first terminal of the electronic device;
   a second external insulation layer disposed under the central insulation layer, the second external insulation layer having a second opening for exposing a second terminal of the electronic device;
   a pad via defined by burying the first opening of the first external insulation layer;
   an external circuit pattern on the first external insulation layer;
   a coverlay on the first external insulation layer, and exposing a top surface of the external circuit pattern;
   a first bump on the top surface of the external circuit pattern and protruded from a top surface of the coverlay; and
   a second bump on the first bump;
   wherein the pad via comprises a via area for burying the first opening and a pad area extended to the first external insulation layer from the via area;
   wherein the pad area is constituted by two layers;
   wherein the first bump is a copper bump; and
   wherein the second bump is a solder bump.

8. The printed circuit board according to claim 7, wherein a lower portion of the pad area serves as a seed layer for forming the via area.

* * * * *